(12) United States Patent
Chang et al.

(10) Patent No.: US 8,806,731 B2
(45) Date of Patent: Aug. 19, 2014

(54) METHOD OF REPAIRING A PROBE BOARD

(75) Inventors: Myung Whun Chang, Seoul (KR); Dae Hyeong Lee, Seoul (KR); Ki Pyo Hong, Gyunggi-do (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 635 days.

(21) Appl. No.: 12/987,697

(22) Filed: Jan. 10, 2011

(65) Prior Publication Data

US 2012/0037408 A1  Feb. 16, 2012

(30) Foreign Application Priority Data

Aug. 13, 2010  (KR) .................. 10-2010-0078499

(51) Int. Cl.
  *B23P 6/00*  (2006.01)
(52) U.S. Cl.
  USPC ............... 29/402.06; 29/402.19; 29/592.1; 29/843; 29/852
(58) Field of Classification Search
  USPC .............. 29/592.1, 843, 852, 874, 878, 884
  See application file for complete search history.

(56) References Cited

U.S. PATENT DOCUMENTS

| | | | |
|---|---|---|---|
| 6,278,286 B1 * | 8/2001 | Farnworth et al. | 324/750.25 |
| 6,329,829 B1 * | 12/2001 | Farnworth et al. | 324/755.08 |
| 6,729,019 B2 * | 5/2004 | Grube et al. | 29/830 |
| 6,747,465 B2 * | 6/2004 | Esashi et al. | 324/754.07 |
| 7,168,162 B2 * | 1/2007 | Grube et al. | 29/842 |
| 7,786,652 B2 * | 8/2010 | Nakamura et al. | 310/328 |
| 7,948,252 B2 * | 5/2011 | Grube et al. | 324/754.07 |
| 2002/0079135 A1 | 6/2002 | Yazaki et al. | |
| 2008/0238264 A1 * | 10/2008 | Nakamura et al. | 310/364 |

FOREIGN PATENT DOCUMENTS

| | | |
|---|---|---|
| JP | 62-277791 A | 12/1987 |
| JP | 4-348595 A | 12/1992 |
| JP | 2002-359470 A | 12/2002 |
| JP | 2005-079144 A | 3/2005 |
| JP | 2010-135714 A | 6/2010 |
| KR | 10-2008-0015124 A | 2/2008 |

OTHER PUBLICATIONS

Japanese Office Action, and English translation thereof, issued in Japanese Patent Application No. 2011-001786 dated Aug. 14, 2012.

* cited by examiner

*Primary Examiner* — Carl Arbes
(74) *Attorney, Agent, or Firm* — McDermott Will & Emery LLP

(57) ABSTRACT

There is provided a method of repairing a probe board, the method including: preparing a plurality of first via electrodes filled with a first filling material in a board body formed as a ceramic sintered body; forming a via hole for an open via electrode among the plurality of first via electrodes; filling the via hole with a second filling material having a lower sintering temperature than that of the first filling material; and forming a second via electrode by sintering the second filling material. The open via repair according to the present invention improves the manufacturing yield of the board and reduces the manufacturing costs thereof.

8 Claims, 3 Drawing Sheets

METHOD OF REPAIRING A PROBE BOARD

CROSS-REFERENCE TO RELATED APPLICATIONS

This application claims the priority of Korean Patent Application No. 10-2010-0078499 filed on Aug. 13, 2010, in the Korean Intellectual Property Office, the disclosure of which is incorporated herein by reference.

BACKGROUND OF THE INVENTION

1. Field of the Invention

The present invention relates to a method of repairing a probe board and a probe board using the same, and more particularly, to a method of repairing a probe board capable of improving manufacturing efficiency by repairing the probe board through a simple process and a probe board using the same.

2. Description of the Related Art

A general semiconductor test apparatus includes a tester, a performance board, a probe card, a chuck and a prober, and serves to test the electrical characteristics of chips manufactured on a wafer. Herein, the probe card receives signals generated in the tester through the performance board and transmits the signals to pads of the chips formed on the wafer, and also transmits signals outputted from the pads of the chips to the tester through the performance board.

According to the related art, a probe card includes a probe board having an opening at the center thereof and a signal line formed therein, a probe fixing part connected to the opening of the probe board, and a probe fixed to a bottom surface of the probe fixing part.

With a recent trend for high-integrated and compact products, the size of a chip to be tested has been reduced and the size of a probe card used for testing the chip has also been reduced.

In line with this trend, the thickness of a signal line in a product having electrical characteristics should be designed and manufactured to be increasingly thinner.

In particular, a variety of functions were previously performed by using individual wiring circuit boards; however, the functions are now integrated on a single wiring circuit board so as to enable the circuit board to be compact. Accordingly, the density of wires used on the circuit board is increased, and as a result, the number of nets and paths to be actually connected is increased geometrically. In the case that even one of these paths is defective, the circuit board should be discarded.

However, in the case that open defects occur in a specific net within a circuit board which has already been fired, it is very difficult to repair the specific defective net or path. In this case, the defective board should be discarded and then replaced with a new board.

SUMMARY OF THE INVENTION

An aspect of the present invention provides a method of repairing a probe board capable of reducing manufacturing costs by repairing a probe board having a via-open defect therein through a simple process and a probe board using the same.

According to an aspect of the present invention, there is provided a method of repairing a probe board, the method including: preparing a plurality of first via electrodes filled with a first filling material in a board body formed as a ceramic sintered body; forming a via hole for an open via electrode among the plurality of first via electrodes; filling the via hole with a second filling material having a lower sintering temperature than that of the first filling material; and forming a second via electrode by sintering the second filling material.

The first filling material may be copper or silver.

The second filling material may be silver nano powder.

The second filling material may be sintered at 400° C. or less.

The via hole for the open via electrode may have a depth ranging from 1 mm to 4 mm.

The via hole for the open via electrode may have a diameter ranging from 100 μm to 500 μm.

The via hole may be formed by laser drilling or mechanical drilling.

The second filling material may have a particle size ranging from 50 nm to 500 nm.

According to another aspect of the present invention, there is provided a probe board including: a board body formed as a ceramic sintered body; a plurality of first via electrodes formed in the board body, the first via electrodes being filled with a first filling material; and a second via electrode filled with a second filling material having a lower sintering temperature than that of the first filling material.

The first filling material may be copper or silver.

The second filling material may be silver nano powder.

The second filling material may be sintered at 400° C. or less.

The second via electrode may have a depth ranging from 1 mm to 4 mm.

The second via electrode may have a diameter ranging from 100 μm to 500 μm.

The second filling material may have a particle size ranging from 50 nm to 500 nm.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
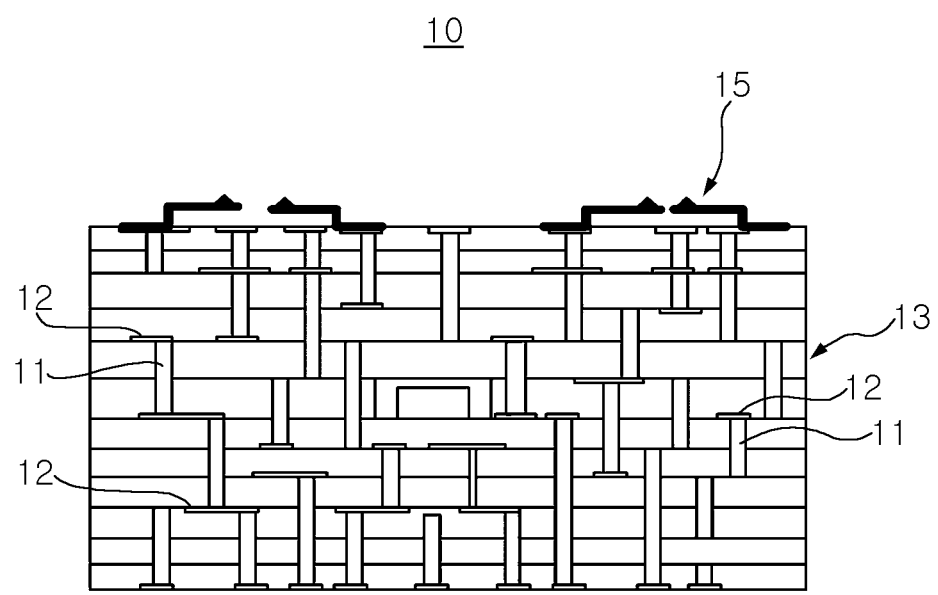
FIG. 1 is a cross-sectional view illustrating a probe card manufactured according to an exemplary embodiment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions may be exaggerated for clarity, and the same reference numerals will be used throughout to designate the same or like elements.

FIG. 1 is a cross-sectional view illustrating a probe card manufactured according to an exemplary embodiment of the present invention.

A probe card according to an exemplary embodiment of the invention includes a probe board 13 having a via electrode formed therein and a probe 15 connected to the probe board 13.

Signals generated in a tester of the probe board 13 are transmitted to external electrode pads of the probe board 13 through a performance board. These signals pass through a plurality of via electrodes and internal electrode patterns within the probe board 13 and are then transmitted to chip pads through the probe 15. Signals outputted from the chip pads pass through the probe 15, the external and internal electrode patterns and the via electrodes, and are then transmitted to the tester through the performance board.

In this manner, a semiconductor test apparatus determines whether chips manufactured on a wafer are defective or not, through the inputting and outputting of the signals.

However, when one of the plurality of via electrodes making electrical connections in the probe board 13 has an open defect, the entirety of the probe card becomes defective, so the probe card should be discarded.

However, a method of repairing a probe board according to an exemplary embodiment of the invention allows for repairs to a probe board having open defects in a via electrode, so that the degree of defects in the board may be reduced.

The probe board 13 may include a low temperature co-fired ceramic (LTCC) substrate, in which the probe 15 and a plurality of via electrodes 11 are formed. In the case that a defective via electrode among the plurality of via electrodes 11 is repaired, this repaired via electrode may serve to make electrical connections between the internal or external electrode patterns in the same manner as the via electrodes 11.

According to an exemplary embodiment of the invention, an internal circuit that is compact and superior in electrical connectivity is provided to be advantageous in high-frequency measurement, and a probe board is repaired through a simple process so that the manufacturing costs thereof may be reduced.

FIGS. 2A through 2D are views illustrating a method of repairing a probe board according to an exemplary embodiment of the present invention.

Figure 2A:
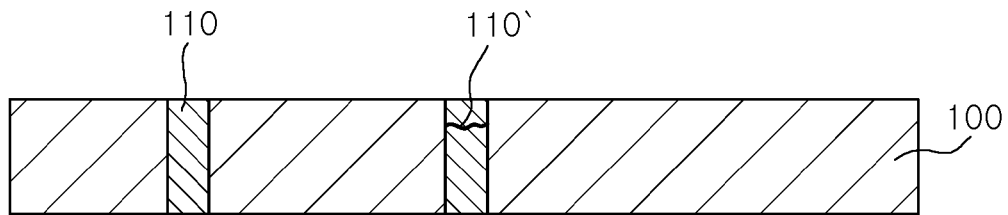
FIGS. 2A through 2D are views illustrating a method of repairing a probe board according to an exemplary embodiment of the present invention.

FIG. 2A shows forming a plurality of first via electrodes 110 filled with a first filling material in a board body formed as a ceramic sintered body (hereinafter, also referred to as "ceramic sheet").

As shown in FIG. 2A, the probe board according to this embodiment has a ceramic stack structure in which ceramic sheets 100 are stacked.

The probe board has a plurality of ceramic sheets being stacked. The plurality of first via electrodes 110 and internal electrodes (not shown) having electrical conductivity therebetween are provided inside the probe board.

The first via electrodes 110 and the internal electrodes may be formed of the first filling material. The first filling material may be silver (Ag), copper (Cu) or the like, which has superior electrical conductivity.

The ceramic sheet may include glass, a binder, a ceramic filler and the like. The ceramic sheet may be prepared by any suitable process known in the art such as a doctor blade process.

In this case, $SiO_2$, $B_2O_3$, CaO, MgO, or the like may be included as glass components. $Al_2O_3$, Ba-based or Bi-based ceramics, or the like may be employed as the ceramic filler according to desired dielectric properties.

Since an LTCC process is used in the exemplary embodiment of the invention, the ceramic sheet 100 may be an LTCC sheet whose firing temperature is in the range of approximately 700° C. to 900° C. Meanwhile, although not shown, pads may be provided on an upper surface of the ceramic stack and serve as a connection area with the probe of the probe board. The pads may be electrically connected to the first via electrodes 110 and the internal electrodes.

With reference to FIG. 2A, the ceramic sheet 100 having the plurality of first via electrodes 110 formed therein is prepared by the above-described method. A via electrode 110' having an open defect (hereinafter, referred to as "open via electrode") among the plurality of first via electrodes 110 is inspected through an open test.

The probe board including the open via electrode 110' is usually discarded; however, a method of repairing a probe board according to an exemplary embodiment of the invention allows the open via electrode 110' to be repaired, so that the probe board may be reused.

Figure 2B:
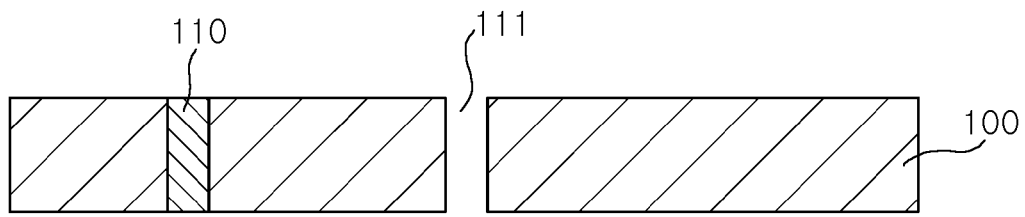

FIG. 2B shows forming a via hole 111 for the open via electrode 110' among the plurality of first via electrodes 110.

The via hole 111 may be formed by laser drilling or mechanical drilling, but is not limited thereto.

Since the via hole 111 is formed by laser drilling or mechanical drilling, the depth of the via hole 111 for the open via electrode 110' may range from 1 mm to 4 mm. Also, the diameter of the via hole 111 may range from 100 μm to 500 μm.

Figure 2C:
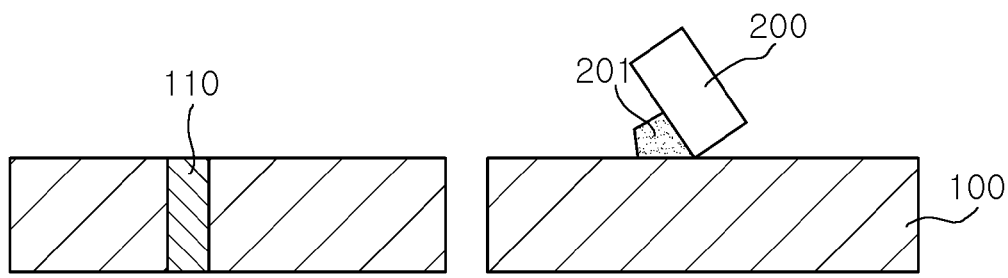
Figure 2D:
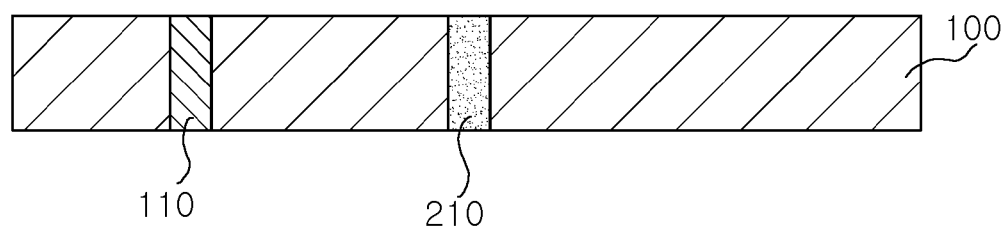

FIG. 2C shows filling the via hole 111 with a second filling material 201.

The second filling material 201 may be nano powder having a sintering temperature lower than that of the first filling material.

The second filling material 201 may be silver nano powder, but is not limited thereto. The particle size of the second filling material 201 may range from 50 nm to 500 nm. In the case in which the size of silver particles is less than 50 nm, the silver particles may coalesce at room temperature. In the case in which the size of silver particles is greater than 500 nm, the silver particles may not be fired at low temperature. For this reason, the size of silver particles may range from 50 nm to 500 nm.

The filling of the nano powder may be performed by a squeezer 200.

Since the sintering temperature of the second filling material is lower than that of the first filling material, in the case that the second filling material filling the via hole 111 is sintered at a higher temperature than the sintering temperature of the ceramic sheet 100 and the first filling material filling the first via electrodes 110, the ceramic sheet 100 and the first via electrodes 110 may be damaged during the sintering of the second filling material.

However, according to the exemplary embodiment of the invention, since the sintering temperature of the second filling material is lower than that of the first filling material, the ceramic sheet 100 and the first via electrodes 110 may be only slightly affected thereby.

The sintering temperature of the second filling material may be 400° C. or less.

In this manner, when the via hole 111 is filled with the second filling material 201 and the second filling material 201 is sintered, the open via electrode 110' is repaired, and accordingly, a second via electrode 210 refilled with the second filling material 201 is formed.

Then, internal and external electrodes are added to the ceramic sheets 100, and the ceramic sheets 100 are stacked to form the probe board.

Figure 3:
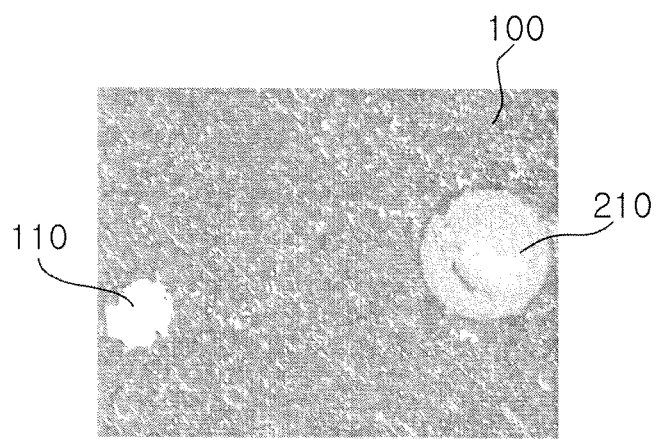
FIG. 3 is a plan view illustrating a repaired via according to an exemplary embodiment of the present invention.

FIG. 3 is a plan view illustrating a repaired via according to an exemplary embodiment of the present invention.

With reference to FIG. 3, the first via electrode 110 and the second via electrode 210, which is formed by repairing the open via electrode 110', are shown on the surface of the ceramic sheet 100. The size of the second via electrode 210 may range from 100 μm to 500 μm.

According to an exemplary embodiment of the invention, a method of repairing a probe board is provided. The ceramic sheet 100 having the plurality of first via electrodes 110 filled with the first filling material is prepared. The open test of the ceramic sheet 100 is performed to check the position of the open via electrode 110' among the plurality of first via electrodes 110.

In order to repair the open via electrode 110', the open via electrode 110' is subject to mechanical or laser drilling, thereby forming the via hole 111. This via hole 111 is filled with the second filling material 201 having a lower sintering temperature than that of the first filling material by the use of the squeezer 200. The second filling material may be silver nano powder.

Thereafter, the ceramic sheet 100 filled with the second filling material is sintered, and thus the ceramic sheet 100, having no open via electrode, is formed.

In a method of repairing a probe board according to an exemplary embodiment of the invention, an open via electrode may be repaired through a simple process. This open via repair allows for the reuse of the probe board, as compared with a conventional board which has been discarded when it has a defective via electrode among a plurality of via electrodes, so that a waste of raw materials may be prevented. Accordingly, the manufacturing costs of the probe board may be reduced and the defectivity rate of the probe board may be significantly reduced.

As set forth above, when open or short defects occur in a via of a probe board, a method of repairing a probe board according to exemplary embodiments of the invention provides a reduction in manufacturing costs by allowing the probe board to be repaired through a simple process.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of repairing a probe board, the method comprising:
    preparing a plurality of first via electrodes filled with a first filling material in a board body formed as a ceramic sintered body;
    inspecting an open defect in the first filling material of the plurality of first via electrodes;
    removing the first filling material having the open defect from the first via electrodes;
    filling a second filling material, having a lower sintering temperature than that of the first filling material, into a via hole of the first via electrodes from which the first filling material is removed; and
    forming a second via electrode by sintering the second filling material.

2. The method of claim 1, wherein the first filling material is copper or silver.

3. The method of claim 1, wherein the second filling material is silver nano powder.

4. The method of claim 1, wherein the second filling material is sintered at 400° C. or less.

5. The method of claim 1, wherein the via hole for the open via electrode has a depth ranging from 1 mm to 4 mm.

6. The method of claim 1, wherein the via hole for the open via electrode has a diameter ranging from 100 μm to 500 μm.

7. The method of claim 1, wherein the via hole is formed by laser drilling or mechanical drilling.

8. The method of claim 1, wherein the second filling material has a particle size ranging from 50 nm to 500 nm.

\* \* \* \* \*